United States Patent
Kong et al.

(10) Patent No.: US 12,254,953 B2
(45) Date of Patent: Mar. 18, 2025

(54) CALIBRATION DEVICE AND MEMORY DEVICE INCLUDING THE CALIBRATION DEVICE FOR A HIGH-SPEED DATA I/O OPERATION UNDER A LOW POWER CONDITION

(71) Applicant: SK hynix Inc., Gyeonggi-do (KR)

(72) Inventors: In Seok Kong, Gyeonggi-do (KR);
Chan Keun Kwon, Gyeonggi-do (KR);
Hee Jun Kim, Gyeonggi-do (KR);
Sung Ah Lee, Gyeonggi-do (KR); Jung Hwan Lee, Gyeonggi-do (KR); Jun Seo Jang, Gyeonggi-do (KR); Jae Hyeong Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 74 days.

(21) Appl. No.: 18/447,311

(22) Filed: Aug. 10, 2023

(65) Prior Publication Data
US 2024/0331742 A1 Oct. 3, 2024

(30) Foreign Application Priority Data
Mar. 29, 2023 (KR) .......................... 10-2023-0041085

(51) Int. Cl.
*G11C 7/10* (2006.01)

(52) U.S. Cl.
CPC .... *G11C 7/1048* (2013.01); *G11C 2207/2254* (2013.01)

(58) Field of Classification Search
CPC .......... G11C 7/1048; G11C 2207/2254; G11C 7/222; G11C 7/1006
See application file for complete search history.

(56) References Cited

U.S. PATENT DOCUMENTS

| | | | |
|---|---|---|---|
| 7,042,252 B2 | 5/2006 | Galloway et al. | |
| 7,795,926 B2 | 9/2010 | Tseng et al. | |
| 2005/0237086 A1 | 10/2005 | Galloway et al. | |
| 2019/0187189 A1* | 6/2019 | Jeter | G11C 29/028 |

* cited by examiner

*Primary Examiner* — Xiaochun L Chen
(74) *Attorney, Agent, or Firm* — IP & T GROUP LLP

(57) ABSTRACT

A calibration device is coupled to a communication line shared by plural devices. The calibration device is configured to perform an iterative eye width scanning by adjusting a set voltage level by a preset level from a first voltage level to a reference center voltage level, wherein the first voltage level corresponds to a cross point where values of signals or data, which are transmitted via the communication lines, are changed in different directions; and determine, as a zero crossing for the signals or the data, a voltage level corresponding to a largest value among a plurality of eye widths obtained through the iterative eye width scanning.

20 Claims, 8 Drawing Sheets

CALIBRATION DEVICE AND MEMORY DEVICE INCLUDING THE CALIBRATION DEVICE FOR A HIGH-SPEED DATA I/O OPERATION UNDER A LOW POWER CONDITION

CROSS-REFERENCE TO RELATED APPLICATIONS

This patent application claims the benefit of priority under 35 U.S.C. § 119(a) to Korean Patent Application No. 10-2023-0041085, filed on Mar. 29, 2023, the entire disclosure of which is incorporated herein by reference.

TECHNICAL FIELD

One or more embodiments of the present disclosure described herein relate to a calibration device and a memory device, and more particularly, to the calibration device for high-speed data input/output operation in a low power environment, the memory device including the calibration device, and operation methods thereof.

BACKGROUND

A memory device or a memory system is typically used as an internal circuit, a semiconductor circuit, an integrated circuit, and/or a removable device in a computing system or an electronic apparatus. There are various types of memory, including a volatile memory and a non-volatile memory. The volatile memory may require power to maintain data. The volatile memory may include a random access memory (RAM), a dynamic random access memory (DRAM), a static random access memory (SRAM), a synchronous dynamic random access memory (SDRAM), and the like. The non-volatile memory can maintain data stored therein when power is not supplied. The non-volatile memory may include a NAND flash memory, a NOR flash memory, a Phase Change Random Access Memory (PCRAM), a Resistant Random Access Memory (RRAM), a Magnetic Random Access Memory (MRAM), etc.

A memory device for storing a large amount of data may include a plurality of memory dies or semiconductor chips, which are coupled to a memory controller configured to control the plurality of memory dies or semiconductor chips. For high-speed data input/output operations, calibration is required to ensure accuracy and reliability in transmission and reception of data or signals.

BRIEF DESCRIPTION OF THE DRAWINGS

The description herein makes reference to the accompanying drawings wherein like reference numerals refer to like parts throughout the figures.

DETAILED DESCRIPTION

Figure 1:
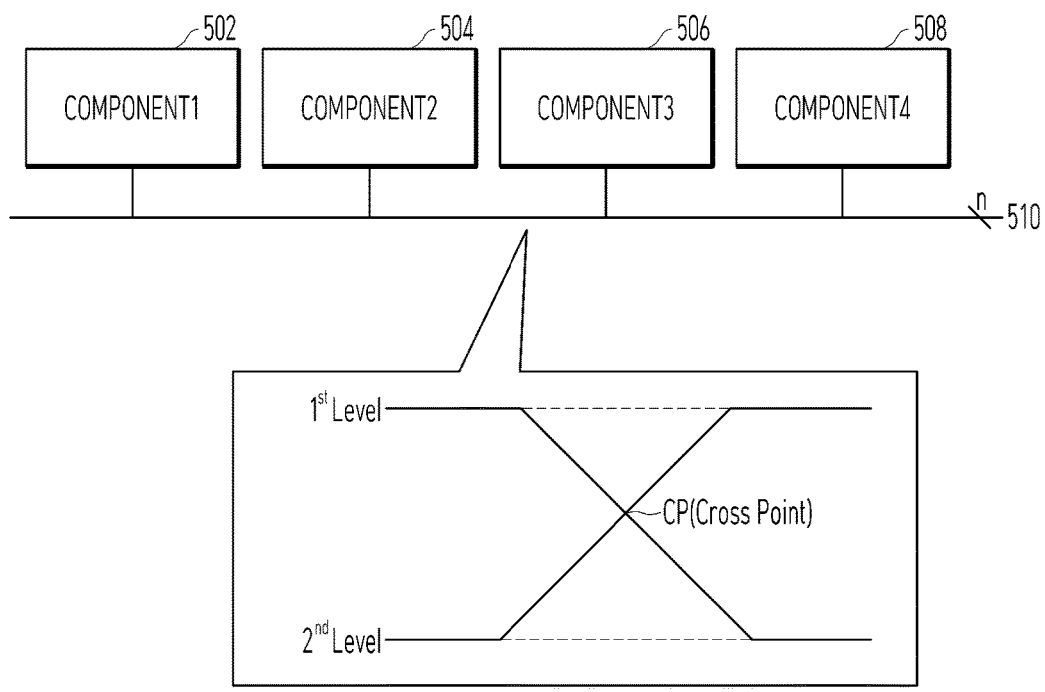
FIG. 1 illustrates an electronic apparatus according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components e.g., an interface unit, circuitry, etc.

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational, e.g., is not turned on nor activated. Examples of block/unit/circuit/component used with the "configured to" language include hardware, circuits, memory storing program instructions executable to implement the operation, etc. Additionally, "configured to" can include a generic structure, e.g., generic circuitry, that is manipulated by software and/or firmware, e.g., an FPGA or a general-purpose processor executing software to operate in manner that is capable of performing the task(s) at issue. "Configured to" may also include adapting a manufacturing process, e.g., a semiconductor fabrication facility, to fabricate devices, e.g., integrated circuits that are adapted to implement or perform one or more tasks.

As used in this disclosure, the term 'machine,' 'circuitry' or 'logic' refers to all of the following: (a) hardware-only circuit implementations such as implementations in only analog and/or digital circuitry and (b) combinations of circuits and software and/or firmware, such as (as applicable): (i) to a combination of processor(s) or (ii) to portions of processor(s)/software including digital signal processor(s), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'machine,' 'circuitry' or 'logic' applies to all uses of this term in this application, including in any claims. As a further example, as used in this application, the term 'machine,' 'circuitry' or 'logic' also covers an implementation of merely a processor or multiple processors or portion of a processor and its (or their) accompanying software and/or firmware. The term 'machine,' 'circuitry' or 'logic' also covers, for example, and if applicable to a particular claim element, an integrated circuit for a storage device.

As used herein, the terms 'first,' 'second,' 'third,' and so on are used as labels for nouns that they precede, and do not imply any type of ordering, e.g., spatial, temporal, logical, etc. The terms 'first' and 'second' do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term 'based on' is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

An embodiment of the present invention may provide a calibration device and a calibration method for improving reliability and accuracy of transmitting and receiving data or signals between two components.

An embodiment of the present invention can reduce time and power consumed for calibration, thereby improving reliability and accuracy of data or signal transmission/ reception in a storage device or data processing apparatus capable of high-speed data input and output operation in a low-power environment.

An embodiment of the present invention can provide a storage device or data processing device having reliability and accuracy in transmitting and receiving data or signals by suppressing, avoiding, or reducing exposure to crosstalk, ringing, overshooting, or undershooting of data or signals due to simultaneous switching noise (SSN) that may occur in a data line shared by a plurality of transmission and reception devices.

In an embodiment of the present invention, a calibration device can be coupled to a communication line shared by plural devices. The calibration device can be configured to: perform an iterative eye width scanning by adjusting a set voltage level by a preset level from a first voltage level to a reference center voltage level, wherein the first voltage level corresponds to a cross point where values of signals or data, which are transmitted via the communication line, are changed in different directions; and determine, as a zero crossing for the signals or the data, a voltage level corresponding to a largest value among a plurality of eye widths obtained through the iterative eye width scanning.

The calibration device can be further configured to: transmit a preset sequence and an inverted sequence of the preset sequence into at least one of the plural devices; and detect the cross point which is an intersection of the preset sequence and the inverted sequence. The preset sequence and the inverted sequence can be DC balanced data having a same frequency of '0' and '1'.

The calibration device can be further configured to perform compensation or adjustment for a quadrature phase by using four different phase clocks including two duty-cycle clocks and two quadrature phase clocks.

The calibration device can include a bang-bang phase detector using the four different phase clocks. The bang-bang phase detector can be configured to detect the cross point based on the frequency of '1'.

The bang-bang phase detector can include plural first logic gates, each first logic gate configured to output a result of an exclusive OR (XOR) operation on two among data sampled by the four different phase clocks; plural second logic gates, each second logic gate configured to output a result of an exclusive OR (XOR) operation on a value of '1' and each data piece sampled by the two quadrature phase clocks; plural flip-flops coupled to the plural first logic gates and the plural second logic gates; and a counter configured to increase or decrease at least one parameter associated with the four different phase clocks based on the plural flip-flops.

The calibration device can perform the iterative eye width scanning by adjusting the set voltage level from the first voltage level to the reference center voltage by the preset level; performing iterative scanning for adjusting the two quadrature phase clocks to measure a start and an end of an eye width corresponding to an adjusted set voltage level for determining a current eye width; and replacing a previously stored eye width obtained during the iterative scanning with the current eye width when the current eye width is larger than the previously stored eye width. The calibration device can determine, as the zero crossing, a voltage level corresponding to the stored eye width.

The calibration device can perform the iterative eye width scanning and determine the zero crossing for each of the plural devices in a separate and independent manner, the signals or the data exposed to crosstalk, ringing, overshooting, or undershooting due to a simultaneous switching noise while transmitted via the communication line.

In an embodiment, a memory system can include plural memory dies configured to store data; a data channel shared by the plural memory dies; and a memory controller configured to control a data input/output operation performed on the plural memory dies. The memory controller can be further configured to: perform an iterative eye width scanning by adjusting a set voltage level by a preset level from a first voltage level to a reference center voltage level, wherein the first voltage level corresponds to a cross point where values of signals or data, which are transferred through the data channel, are changed in different directions; determine, as a zero crossing for the signals or the data, a voltage level corresponding to a largest value among a plurality of eye widths obtained through the iterative eye width scanning; and exchange the signals or the data with the plural memory dies via the data channel based on the zero crossing to control a data input/output operation performed on the plural memory dies.

The memory controller can include a calibration logic configured to transmit a preset data sequence and an inverted sequence of the preset data sequence into the plural memory dies to detect the cross point; and a calibration buffer configured to store the zero crossing for each of the plural memory dies, the zero crossing output from the calibration logic.

The preset data sequence and the inverted sequence can be DC balanced data having a same frequency of '0' and '1'.

The calibration logic can be further configured to perform compensation or adjustment for a quadrature phase by using four different phase clocks including two duty-cycle clocks and two quadrature phase clocks.

The calibration logic can include a bang-bang phase detector using the four different phase clocks. The bang-bang phase detector can be configured to detect the cross point based on the frequency of '1'.

The bang-bang phase detector can include plural first logic gates, each first logic gate configured to output a result of an exclusive OR (XOR) operation on two among data sampled by the four different phase clocks; plural second logic gates, each second logic gate configured to output a result of an exclusive OR (XOR) operation on a value of '1' and each data piece sampled by the two quadrature phase clocks; plural flip-flops coupled to the plural first logic gates and the plural second logic gates; and a counter configured to increase or decrease at least one parameter associated with the four different phase clocks based on the plural flip-flops.

The calibration logic can be further configured to perform the iterative eye width scanning by: adjusting the set voltage level from the first voltage level to the reference center voltage by the preset level; performing iterative scanning for adjusting the two quadrature phase clocks to measure a start and an end of an eye width corresponding to an adjusted set voltage level for determining a current eye width; and replacing a previously stored eye width obtained during the iterative scanning with the current eye width when the current eye width is larger than the previously stored eye width. The calibration logic is further configured to determine, as the zero crossing, a voltage level corresponding to a stored eye width.

The memory controller can perform the iterative eye width scanning and determine the zero crossing for individual memory dies in a separate and independent manner, the signals or the data exposed to crosstalk, ringing, overshooting, or undershooting due to a simultaneous switching noise while transmitted via the data channel.

In another embodiment, a method for operating a memory system can include detecting a cross point where values of signals or data are changed in different directions, so as to exchange the data or the signals with plural memory dies via a data channel shared by the plural memory dies; performing an iterative eye width scanning by adjusting a set voltage level by a preset level from a first voltage level, which corresponds to the cross point, to a reference center voltage level; and determining, as a zero crossing for the signals or the data, a voltage level corresponding to a largest value among a plurality of eye widths obtained through the iterative eye width scanning.

The detecting for the cross point can include transmitting a preset data sequence and an inverted sequence of the preset data sequence to at least one of the plural memory dies. The preset data sequence and the inverted sequence can be DC balanced data having a same frequency of '0' and '1'.

The cross point can be detected based on the frequency of '1' of the preset data sequence and the inverted sequence.

The performing the iterative eye width can include adjusting the set voltage level from the first voltage level to the reference center voltage by the preset level; performing iterative scanning for adjusting the two quadrature phase clocks to measure a start and an end of an eye width corresponding to an adjusted set voltage level for determining the current eye width; and replacing a previously stored eye width obtained during the iterative scanning with the current eye width when the current eye width is larger than the previously stored eye width.

The detecting, the performing and the determining can be performed for the individual memory dies in a separate and independent manner.

Embodiments will now be described with reference to the accompanying drawings, wherein like numbers reference like elements.

FIG. 1 illustrates an electronic apparatus according to an embodiment of the present disclosure.

Referring to FIG. 1, an electronic device may include a plurality of components 502, 504, 506, 508. The plurality of components 502, 504, 506, 508 can share a data line or a signal line 510 with each other. The plurality of components 502, 504, 506, 508 may transmit and receive data or signals through the data line or the signal line 510. According to an embodiment, the data line or the signal line 510 may be configured as a channel or a bus which is capable of simultaneously transmitting and receiving data or signals of n bits. The n is a positive integer.

According to an embodiment, the plurality of components 502, 504, 506, 508 may transmit and receive data or signals having two levels (e.g., $1^{st}$ level, $2^{nd}$ level). As such data or signals, digital data or digital signals having a value of '1' or '0' corresponding to the two levels (e.g., $1^{st}$ level, $2^{nd}$ level) may be exemplified. A plurality of components 502, 504, 506, 508 operating at a high speed may transmit and receive a data sequence or a signal sequence including a plurality of bits. An error in the data sequence or the signal sequence including '0' or '1' could be reduced or eliminated if accuracy and reliability of data transmission between a transmission component and a reception component are guaranteed. To this end, the plurality of components 502, 504, 506, 508 or a device coupled to the plurality of components 502, 504, 506, 508 may perform a calibration operation.

According to an embodiment, the calibration operation might be required for high-speed memory because it ensures accuracy and reliability of data transmission. A high-speed memory, such as DDR4 or DDR5, operating at very high frequencies could rely on a precise timing to transfer data between the memory and a CPU. If data transfer is out of a designated timing, an error or data corruption might occur, resulting in a system crash or data loss. During the calibration operation, a memory controller can adjust a timing and a voltage level to optimize signal integrity and ensure that data is transferred accurately and reliably. This process may involve testing and adjusting various parameters such as read and write timings, signal determination and output driver strength. Through performing the calibration operation on the memory, the memory system can achieve the highest possible data transfer rate while maintaining data integrity.

Further, the high-speed memory might require the calibration operation to ensure compatibility with other components included in a computing system, such as the CPU and a motherboard. Each component, such as the plurality of components 502, 504, 506, 508, may have different tolerances and specifications. Thus, the calibration operation can allow the high-speed memory to work seamlessly with other components in the computing system. The calibration operation might be necessary to achieve stable and accurate data transmission and ensure compatibility with other system components.

In the calibration operation, a zero crossing indicates a point where a value of data or a signal is changed from the 1st level to the 2nd level or vice versa. A calibration device may use a first sequence and a second sequence which may have phases opposite to each other, to find a cross point (CP). The cross point could be recognized as a point when values of signals or data are changed in different directions (one is from the 1st level to the 2nd level, and the other is from the 2nd level to the 1st level). The cross point may be found through the calibration operation. The cross point might be determined as the zero crossing. For example, if a voltage level of data or signal is greater than a voltage level corresponding to the crossing point determined as the zero crossing, the corresponding data or signal is recognized as the 1st level among two levels (i.e., 1st level, 2nd level). Otherwise, the corresponding data or signal may be recognized as the 2nd level.

As a time for detecting the zero crossing during the calibration operation is reduced, time and power consumed for the calibration operation could be reduced. In addition, when there is no noise in transmitted and received data or signals, as described in FIG. 1, the cross point found based on the first sequence and the second sequence that may have opposite phases could be determined as the zero crossing, so that an error might not occur in transmission and reception of data or signal. However, when the plurality of components 502, 504, 506, 508 shares the data line or signal line 510, further consideration taken in the calibration operation due to noise will be described later with reference to FIGS. 3 and 4.

Figure 2:
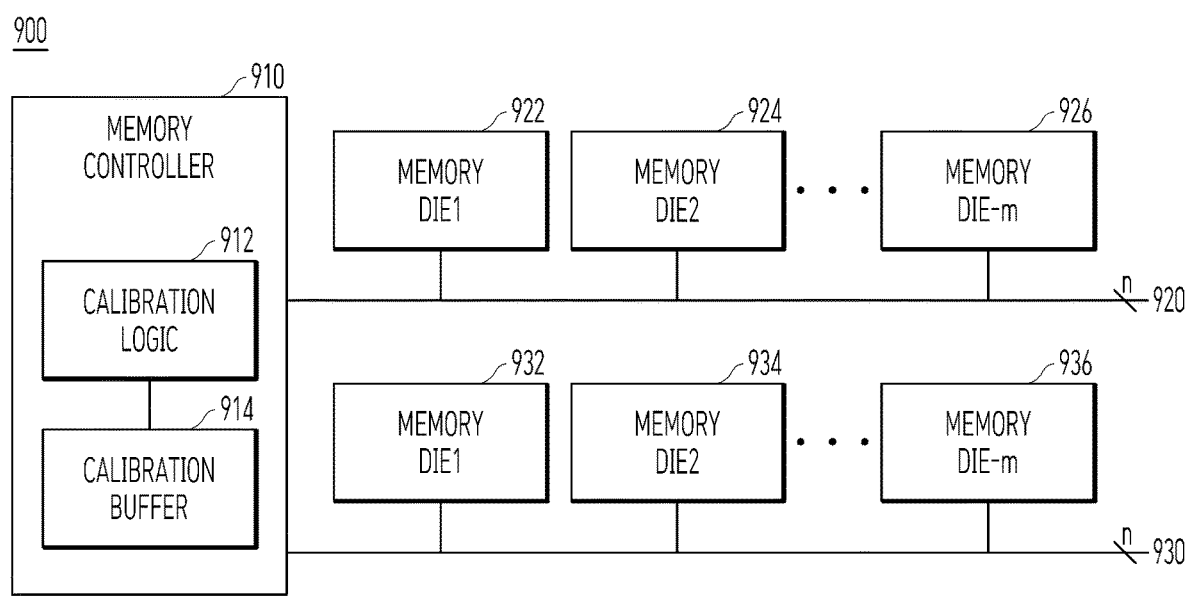
FIG. 2 illustrates a memory system according to an embodiment of the present disclosure.

FIG. 2 illustrates a memory system according to an embodiment of the present disclosure.

Referring to FIG. 2, the memory system 900 may include a memory controller 910. The memory controller 910 may be connected to the plurality of memory dies 922, 924, 926, 932, 934, 936 through a plurality of data channels 920, 930. According to an embodiment, the memory controller 910 and the plurality of memory dies 922, 924, 926, 932, 934, 936 described in FIG. 2 may correspond to the plurality of components 502, 504, 506, 508 shown in FIG. 1.

The plurality of memory dies 922, 924, 926, 932, 934, 936 may include a plurality of volatile memory cells or a plurality of non-volatile memory cells. According to an embodiment, each of the plurality of memory dies 922, 924, 926, 932, 934, 936 may include at least one memory bank or at least one memory plane. Also, according to an embodiment, the plurality of memory dies 922, 924, 926, 932, 934, 936 may all have a same internal configuration or may have different internal configurations. According to an embodiment, the plurality of memory dies 922, 924, 926, 932, 934, 936 which is coupled to the memory controller 910 may be included in different memory chips. Configurations in the plurality of memory dies 922, 924, 926, 932, 934, 936 may vary depending on a purpose of usage, data input/output performance, and the like of the memory system 900. An embodiment of the present invention might not be limited to internal configurations of the plurality of memory dies 922, 924, 926, 932, 934, 936.

A plurality of memory dies is connected to one data channel 920 or 930. For example, a plurality of first memory dies 922, 924, 926 may be connected to the memory controller 910 through a first data channel 920. A plurality of second memory dies 932, 934, 936 may be coupled to the memory controller 910 via a second data channel 930. Each of the first and second data channels 920, 930 may include a plurality of data lines through which data including a plurality of bits or a signal (e.g., command, response, etc.) including a plurality of bits may be transmitted simultaneously. Referring to FIG. 2, each of the first and second data channels 920, 930 may include n data lines. The n is a positive integer.

The memory controller 910 may be coupled to the plurality of memory dies 922, 924, 926, 932, 934, 936 in order to perform data communication. For example, the memory controller 330 can receive a command CMD, address Addr, data, etc. from an external device, and transfer a response Res, status information Stat, data, etc. to the external device. Herein, the external device may include a computing device for storing data in the plurality of memory dies 922, 924, 926, 932, 934, 936 or reading data stored in the plurality of memory dies 922, 924, 926, 932, 934, 936.

The memory controller 910 may perform a calibration operation for high-speed data communication with the plurality of memory dies 922, 924, 926, 932, 934, 936. The memory controller 910 may include a calibration logic 912 configured to perform the calibration operation and a calibration buffer 914 configured to store a result of the calibration operation performed by the calibration logic 912. According to an embodiment, the calibration logic 912 may perform the calibration operation for each of the first and second data channels 920, 930. In addition, the calibration logic 912 may separately, independently, and individually perform the calibration operation for each of the plurality of memory dies which is coupled to each of the first and second data channel 920, 930.

Simultaneous switching output (SSO) may occur between the plurality of first memory dies 922, 924, and 926 and the plurality of second memory dies 932, 934, and 936 connected to the memory controller 910. Here, the simultaneous switching output (SSO) refers to a phenomenon in which several output drivers simultaneously switch to cause signal interference and noise. For example, the simultaneous switching output (SSO) can occur in memory systems or other electronic systems with a multi-chip module, a system-on-chip design, or multiple output drivers. There is a signal integrity issue such as crosstalk, ringing, overshooting, or undershooting which could occur due to the noise and the signal interference when plural output drivers switch simultaneously. As a result, a data transmission error may occur, or overall performance and stability of the memory system 900 may be affected.

A memory device or the memory system 900 including a Peripheral Component Interconnect Express (PCIe) interface may support offset cancellation. The offset cancellation is a type of technique supported by the PCIe interface to remove or cancel direct current (DC) offsets that may exist in transmitted data. In the PCIe, data can be transmitted differentially. That is, data or signals are transmitted as a pair of complementary signals with opposite polarities or phases. However, there may be some residual DC offset in the transmitted data or signals due to various factors such as crosstalk or unbalanced driver characteristics. This offset can cause a DC voltage corrupting received data to appear at receiver's termination. To mitigate effects of this DC offset, the PCIe can support offset cancellation. For offset cancellation, a pair of offset cancellation signals could be sent along with the data signal, designed to have opposite polarities or phases to the data or signals. The pair of offset cancellation signals could be used to cancel any DC offset that may be present in the data or signals. A receiver on a PCIe interface can measure the offset cancellation signal and use this information to cancel any DC offset in the data or signals, improving the accuracy and reliability of received data or signals. The offset cancellation could be used for both data and a clock signal of the PCIe interface. When the memory system 900 supports offset cancellation, the calibration operation becomes more complicated, and time and power consumed for the calibration operation might increase.

Figure 3:
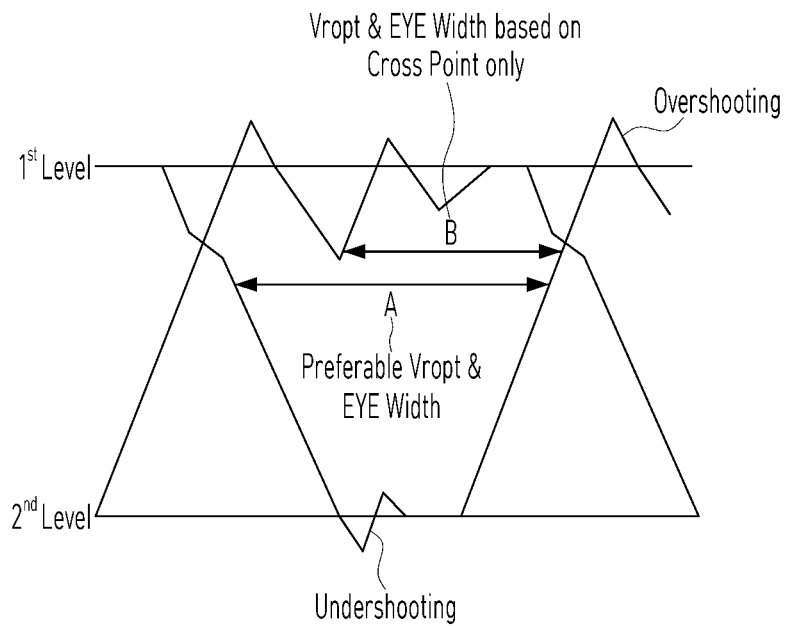
FIG. 3 illustrates a first example of a calibration operation according to an embodiment of the present disclosure.

FIG. 3 illustrates a first example of a calibration operation according to an embodiment of the present disclosure.

Referring to FIG. 3, in a process of changing a value of data or signals from the $1^{st}$ level to the $2^{nd}$ level or vice versa, noise and interference may affect the data or the signals. Comparing FIG. 1 with FIG. 3, it is possible to understand a difference between a case where there is no noise in the data or the signals (FIG. 1) and a case where there is noise in the data or the signals (FIG. 3). FIG. 3 shows that an issue such as ringing, overshooting, or undershooting may occur in the data or the signals.

Overshooting or undershooting of the data or the signals may affect a calibration operation. The calibration operation may include adjusting at least one circuit parameter to improve performance or accuracy. Further, the calibration operation may include measuring and adjusting system components to compensate for inaccuracies or deviations. However, when an input signal to a circuit is overshooting or undershooting, the circuit may operate unexpectedly and affect a process for the calibration operation. For example, when a voltage reference generator in the circuit generates a reference voltage based on an overshooting or undershooting signal, an output voltage might not be accurately calibrated, affecting performance of downstream circuits or systems. Similarly, if the circuit is designed to operate within certain voltage or current limits, overshooting or undershooting of the input signal may cause the circuit to exceed these limits, affecting the calibration operation or causing damage to the circuit. Accordingly, the calibration operation could be performed to ensure a proper operation of the circuit by verifying that the input signal to the circuit is within specified voltage and current limits.

As illustrated in FIG. 1, when the cross point is found through the calibration operation and the cross point is determined as an optimal reference voltage Vropt, the calibration operation could not guarantee reliability and accuracy of data transmission and reception. Because of an issue such as ringing, overshooting, or undershooting, an eye width of the data or signal could be very narrow when the cross point (B shown in FIG. 3) is determined as the optimal reference voltage Vropt. The optimal reference voltage Vropt described in FIG. 3 may correspond to the zero crossing described in FIG. 1.

The calibration operation according to an embodiment of the present invention does not determine the cross point (CP) as the optimal reference voltage Vropt. The calibration can determine a set voltage level (A shown in FIG. 3) with the widest eye width as the optimal reference voltage Vropt. To this end, the calibration operation may include a first operation of finding the cross point and a second operation of adjusting and finding the set voltage level (A shown in FIG. 3) having the widest eye width among other voltage levels between the cross point and a reference center voltage.

Meanwhile, to consider an issue such as ringing, overshooting, or undershooting of the data or the signals, the memory controller 910 can perform the calibration operation through full 2D scanning (Full 2D scanning). Full 2D scanning is a type of calibration technique used in a high-speed digital communication system to optimize a timing and voltage levels of transmitted signals, performing a comprehensive detection over the entire two-dimensional space of signal timing and voltage levels to select an optimal setting that opens the widest eye, i.e., has the largest eye width. In the full 2D scanning, a series of test patterns with different timings and voltage levels could be transmitted while monitoring an eye diagram constructed by plotting the voltages and timings of the received signals. Timings or voltage levels of transmitted test patterns could be changed systematically, including in the entire two-dimensional space.

However, the full 2D scanning would consume a lot of time and power. An embodiment of the present invention provides an apparatus and a method capable of reducing time and power consumed by the calibration operation. An embodiment of the present invention can provide a device or a method for more quickly detecting the cross point in the first operation during a calibration operation. Further, an embodiment of the present invention can provide a device and a method capable of reducing time and power consumed in the second operation of detecting a set voltage level (A shown in FIG. 3) having the widest eye width during the calibration operation.

Figure 4:
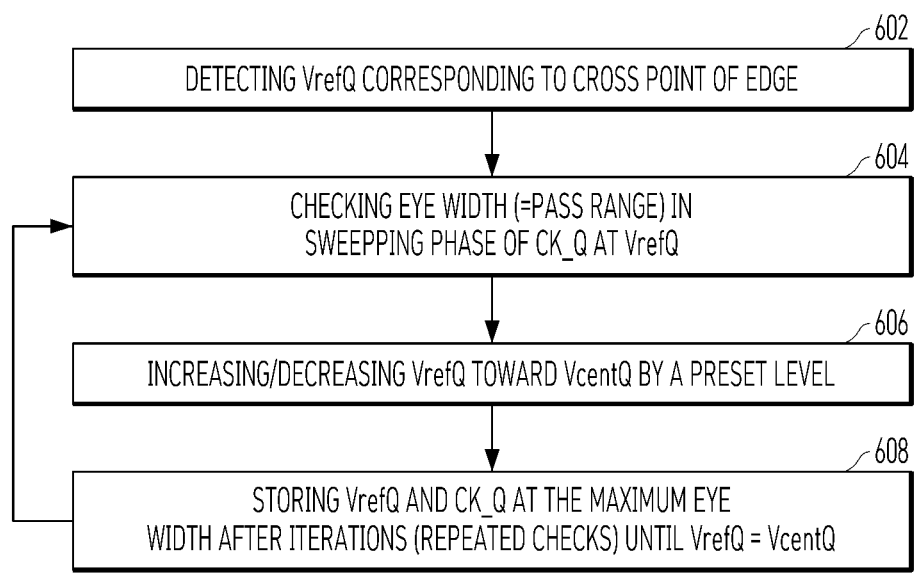
FIG. 4 illustrates a calibration method according to an embodiment of the present disclosure.

FIG. 4 illustrates a calibration method according to an embodiment of the present disclosure.

Referring to FIG. 4, the calibration method includes detecting a set reference voltage VrefQ corresponding to a cross point where values of data or signals transition (operation 602), sweeping a phase of a quadrature phase clock CK_Q at the set reference voltage VrefQ to check or scan an eye width (operation 604), increasing or decreasing, toward a reference center voltage VcentQ, the set reference voltage VrefQ by a preset level (operation 606), and storing a set reference voltage VrefQ and a quadrature phase clock CK_Q corresponding to the largest eye width while performing iterative scanning (i.e., repeated operations for checking the eye width) by adjusting the set reference voltage VrefQ until the set reference voltage VrefQ reaches the reference center voltage VcentQ (operation 608).

Referring to FIGS. 2 to 4, for the calibration operation, the calibration logic 912 can perform the first operation 602 to detect the set reference voltage VrefQ corresponding to the cross point where value transition of the data or signals occurs. The calibration logic 912 uses a data sequence and an inverted data sequence, which is an inverted value of the data sequence, to detect the cross point where value transition from the $1^{st}$ level to the $2^{nd}$ level or vice versa occurs. The operation of quickly finding the cross point will be described later with reference to FIGS. 5 to 7. As illustrated in FIG. 3, when a set reference voltage VrefQ corresponding to the cross point is set to zero crossing, it may be difficult to ensure reliability and accuracy of transmission and reception of the data or signals.

The calibration logic 912 may perform an eye width scanning from a level of the set reference voltage VrefQ corresponding to the cross point to a level of the reference center voltage VcentQ. Here, the reference center voltage VcentQ may have a mean level between the $1^{st}$ level and the $2^{nd}$ level shown in FIGS. 1 and 3. The set reference voltage VrefQ corresponding to the cross point may be greater or less than the reference center voltage VcentQ according to noise or interference generated in the first and second data channels 920, 930. For example, FIG. 3 illustrates a case where the set reference voltage VrefQ corresponding to the cross point has a higher level than the reference center voltage VcentQ. If the calibration logic 912 carries out the eye width scanning in all regions between the $1^{st}$ level and the $2^{nd}$ level, time and power consumption for the calibration operation would increase. Even if the set reference voltage VrefQ corresponding to the cross point approaches the first level or the second level, an eye width at the 1$^{st}$ level or the 2$^{nd}$ level would be smaller than an eye width at the set reference voltage VrefQ. Accordingly, the calibration logic 912 does not need to check an eye width at any voltage level between the set reference voltage VrefQ and the 1$^{st}$ level or the 2$^{nd}$ level. Accordingly, the calibration logic 912 may set, as a target area or a target range for the eye width scanning, an area or a range from the set reference voltage VrefQ corresponding to the cross point to the reference center voltage VcentQ (see FIG. 7).

When the target area or the target range for the eye width scanning is determined, the calibration logic 912 can change the phase of the quadrature phase clock CK_Q at the set reference voltage VrefQ corresponding to the cross point (sweeping operation) to check the eye width (operation 604). A detailed operation related to the eye width scanning will be described later with reference to FIGS. 8 and 9.

After checking the eye width corresponding to the set reference voltage VrefQ (operation 604), the set reference voltage VrefQ may be increased or decreased by a predetermined level. At this time, the increase or decrease of the reference voltage VrefQ can be performed toward the reference center voltage VcentQ. For example, when a level of the set reference voltage VrefQ corresponding to the cross point is higher than that of the reference center voltage VcentQ, the level of the set reference voltage VrefQ may be gradually reduced until it reaches the level of the reference center voltage VcentQ. Conversely, if a level of the set reference voltage VrefQ corresponding to the cross point is lower than that of the reference center voltage VcentQ, the level of the reference voltage VrefQ may be gradually increased until it reaches the level of the reference center voltage VcentQ.

The preset amount/level by which the set reference voltage VrefQ increases or decreases may vary depending on an embodiment. For example, the predetermined amount/level (e.g., 0.1 V, 0.05 V, 0.01 V, etc.) can be determined based on a difference (e.g., 5V, 3V, 1.8V, 1.4V, etc.) between the 1$^{st}$ level and the 2$^{nd}$ level, operational performance (e.g., a data input/output speed, etc.) of the memory controller 910 or the memory system 900, a data input/output speed of the plurality of memory dies 922, 924, 926, 932, 934, 936, and the like. As the preset amount/level becomes smaller, performance of the calibration operation can be improved through fine adjustment of the set reference voltage VrefQ.

If a current eye width is greater than a previous eye width, a current set reference voltage VrefQ and a quadrature phase clock CK_Q corresponding to the current set reference voltage VrefQ may be stored (operation 608). For example, based on the set reference voltage VrefQ corresponding to the cross point, the calibration logic 912 can perform a first eye width scanning (operation 604). Then, because there is no previous eye width, the set reference voltage VrefQ and the quadrature phase clock CK_Q corresponding to the set reference voltage VrefQ may be stored (operation 608). After the set reference voltage VrefQ is decreased or increased by the preset level, a second eye width scanning can be performed (operation 604). Then, a first eye width measured through the first eye width scanning (i.e., the previous eye width) and a second eye width measured through the second eye width scanning may be compared with each other. When the second eye width is greater or wider than the first eye width, the set reference voltage VrefQ and the quadrature phase clock CK_Q corresponding to the second eye width may be stored (operation 608). If the first eye width is greater or wider than the second eye width, the set reference voltage VrefQ and the quadrature phase clock CK_Q corresponding to the first eye width may be maintained (i.e., the set reference voltage VrefQ and the quadrature phase clock CK_Q corresponding to the second eye width are not stored) (operation 608). After these iterative operations from the cross point to the reference center voltage VcentQ, the calibration logic 912 may store the set reference voltage VrefQ and the quadrature phase clock CK_Q corresponding to the largest or widest eye width in the calibration buffer 914 (operation 608).

Figure 5:
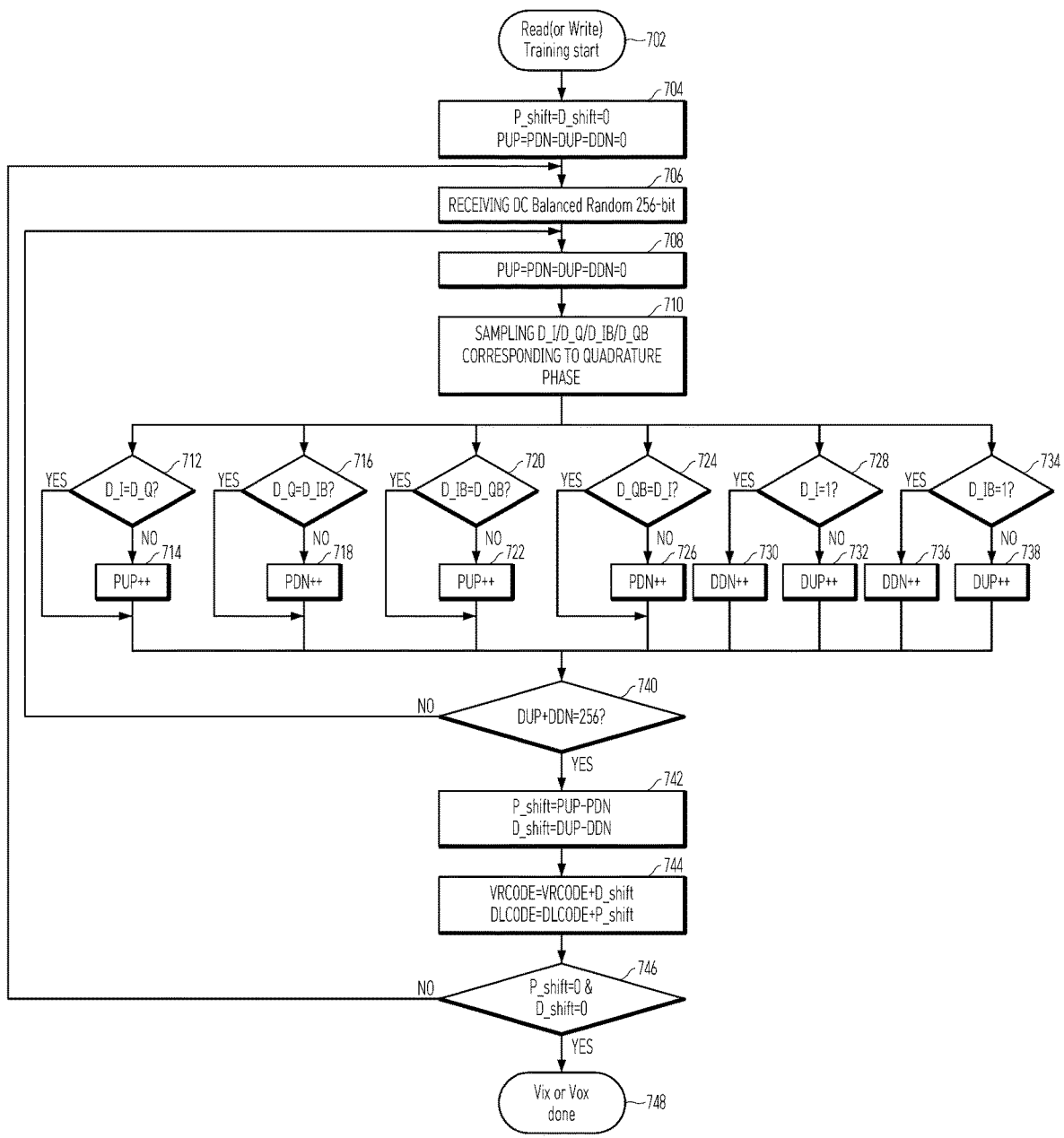
FIG. 5 illustrates a first operation for calibration according to an embodiment of the present disclosure.
Figure 6:
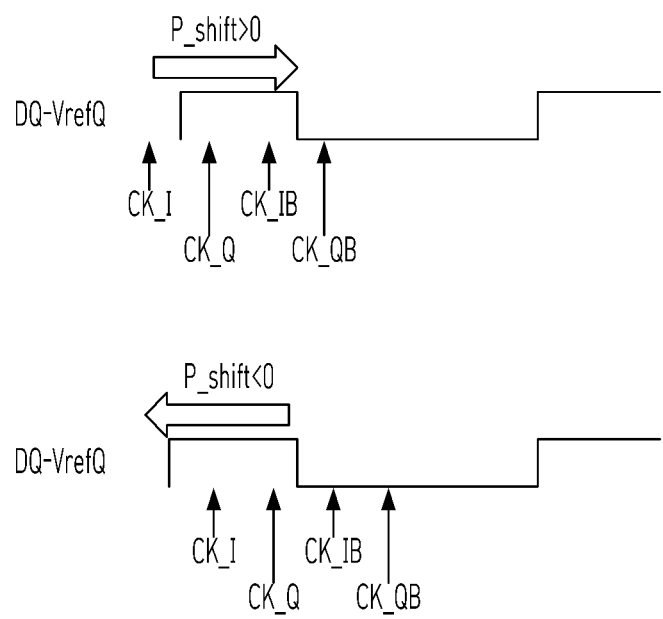
FIG. 6 illustrates a second example of the calibration operation according to an embodiment of the present disclosure.
Figure 7:
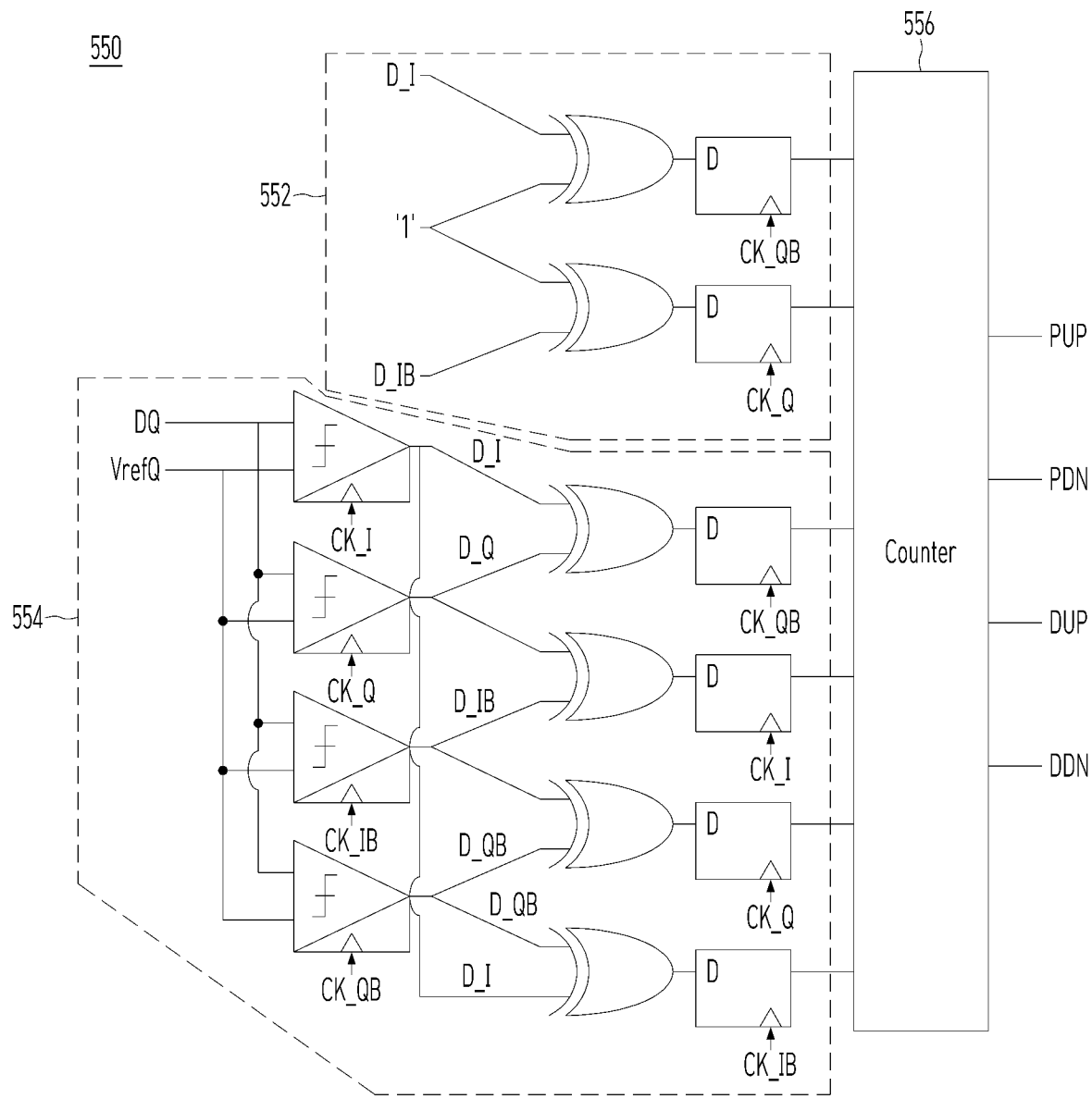
FIG. 7 illustrates an example for a calibration logic according to an embodiment of the present disclosure.

FIG. 5 illustrates the first operation for calibration according to an embodiment of the present disclosure. The first operation for the calibration illustrated in FIG. 5 will be described as an example of operation 602 which is for finding the set reference voltage VrefQ corresponding to the cross point illustrated in FIG. 4. FIG. 6 illustrates a second example of the calibration operation according to an embodiment of the present disclosure. FIG. 7 illustrates an example for a calibration logic according to an embodiment of the present disclosure. The calibration logic 912 illustrated in FIGS. 2 and 6 may include a bang-bang phase detector 550.

Here, bang-bang may indicate that, when a phase of an input signal is changed, an output of a phase detector transitions between two states of a logic high level (e.g., 1st level) and a logic low level (e.g., 2nd level). A bang-bang noise is a type of noise occurring in an electronic system when a signal rapidly transitions between two states. This type of noise is also referred to as a jitter noise because fast transition can cause a timing of signals to jitter or fluctuate. Bang-bang noise can occur in a variety of electronic circuits, including a clock circuit, a digital-to-analog converter (DAC), and a power supply. The bang-bang noise may occur due to switching of transistors or other active components included in a circuit. The bang-bang noise may cause a spike of a voltage or a current propagated through the circuit. The bang-bang noise can cause a noise in the output signal. The calibration operation may include adjusting circuit parameters to improve operational performance or accuracy and measuring and adjusting a variable of a system component to compensate for inaccuracies or deviations. Thus, the calibration operation can help mitigate an effect of the bang-bang noise by ensuring that the circuit operates within specified or designated performance parameters. For example, when circuit's timing is critical and subject to bang-bang noise, the calibration operation can be performed to ensure whether a timing is accurate and stable under various operating conditions. Similarly, the calibration operation for the voltage reference circuit can help reduce an effect of noises on an output voltage, which can be especially important in a low-noise analog circuit.

The bang-bang phase detector 550 included in the calibration logic 912 is a type of phase detector used in digital circuits and systems to compare phases of two signals and generate a digital output showing a phase difference between the two signals. The calibration operation may be performed based on the output of the phase detector to align a frequency or phase of one of two input signals with that of another signal. A simple example of a bang-bang phase detector can be implemented with an XOR gate which produces a logical high-level output when the two input signals have 180-degree phase difference or a logical low-level output when the two input signals are in phase. A more sophisticated bang-bang phase detector may include more complex logic circuits such as D flip-flops or digital delay lines to improve operational accuracy and performance.

According to an embodiment, the calibration logic 912 may include a half rate bang-bang phase detector. The half-rate bang-bang phase detector is a type of phase detector which is used in a digital communication system to detect and correct a phase error between a received signal and a local oscillator signal. The half-rate bang-bang phase detector may be characterized by operating at half frequency of the received signal. The operation of the half-rate bang-bang phase detector can be divided into two stages: a sampling stage and a comparison stage. In the sampling stage, the received signal may be sampled and stored in a memory. In the comparison stage, the stored signal may be compared with the local oscillator signal so that a calibration signal may be generated according to a phase difference between the two signals. The calibration signal is then used to adjust the phase of the local oscillator signal used to sample a next cycle of the received signal. Because this procedure is repeated for each period of the received signal, the half-rate bang-bang phase detector can track the phase change of the received signal to correct an error.

Referring to FIGS. 2 and 5 to 7, the calibration operation may be performed for a read or write operation (operation 702). At the beginning of the calibration operation, all parameters P_shift, D_shift, PUP, PDN, DUP, DDN for phases of the clock may be set to '0' (operation 704). At this time, the calibration logic 912 uses two duty-cycle clocks and two quadrature phase clocks to perform compensation for duty-cycle and quadrature phase together.

According to an embodiment, each of four clocks may have a phase difference corresponding to 90 degrees. For example, a first clock CK_I may have a phase difference of 180 degrees from a third clock CK_IB which is an inverted clock of the first clock CK_I. A second clock CK_Q may have a phase difference of 180 degrees from a fourth clock CK_QB which is an inverted clock of the second clock CK_Q. The first clock CK_I and the second clock CK_Q may have a phase difference of 90 degrees, and the third clock CK_IB and the fourth clock CK_QB may also have a phase difference of 90 degrees.

The calibration logic 912 may receive a 256-bit data sequence DQ (operation 706). In this case, the 256-bit data sequence DQ and a 256-bit inverted data sequence corresponding to the 256-bit data sequence DQ may be a sequence of data having a same frequency of '0' and '1' (DC balanced data).

The calibration logic 912 can reset four results PUP, PDN, DUP, DDN, which are output from a counter 556 of the bang-bang phase detector 500 included in the calibration logic 912, to '0' (operation 708).

The calibration logic 912 can compare the data sequence DQ and the set reference voltage VrefQ, to output sampled data D_I, D_Q, D_IB, D_QB based on the four clock signals CK_I, CK_Q, CK_IB, CK_QB having a phase difference of 90 degrees (operation 710). Thereafter, exclusive OR (XOR) results (i.e., comparison results) for two among the data D_I, D_Q, D_IB, D_QB sampled through the six logic gates described in FIG. 7 may be output (operations 712, 716, 720, 724, 728, 734). The counter 556 may increment the four results PUP, PDN, DUP, DDN based on the XOR results (i.e., comparison results).

For example, the calibration logic 912 may check whether two data D_I, D_Q sampled by two clocks CK_I, CK_Q having a phase difference of 90 degrees are the same through an XOR operation (operation 712). If the two data D_I, D_Q are not identical to each other (NO in the operation 712), the first result PUP may be increased (operation 714).

The calibration logic 912 may check whether two other data D_Q, D_IB sampled by two other clocks CK_Q, CK_IB having a phase difference of 90 degrees are the same through an XOR operation (operation 716). If the two data D_Q, D_IB are not the same (NO in the operation 716), the second result PDN may be increased (operation 718).

Similarly, the calibration logic 912 can check whether two other data D_IB, D_QB sampled by two other clocks CK_IB, CK_QB having a phase difference of 90 degrees are the same through an XOR operation (operation 720). If the two data D_IB, D_QB are not the same (NO in the operation 720), the first result PUP may be increased (operation 722).

The calibration logic 912 can check whether two other data D_QB, D_I sampled by two other clocks CK_QB, CK_I having a phase difference of 90 degrees are the same through an XOR operation (operation 724). If two data D_QB, D_I are not the same (NO in the operation 724), the second result PDN may be increased (operation 726).

Meanwhile, because a data sequence received by the calibration logic 912 is DC balanced data in which the frequencies of '0' and '1' are equal, the cross point can be detected more quickly based on the frequency of '1'. The calibration logic 912 may check whether each of two samples of data D_I, D_IB corresponding to the first clock CK_I and the third clock CK_IB is '1' through an XOR operation (operations 728, 734). If the first sampled data D_I corresponding to the first clock CK_I is '1', the fourth result DDN is increased (operation 730). Conversely, if the first sampled data D_I corresponding to the first clock CK_I is not '1' (i.e., '0'), the third result DUP is increased (operation 732). Also, if the third sampled data D_IB corresponding to the third clock CK_IB is '1', the fourth result DDN is increased (operation 736). Conversely, if the third sampled data D_IB corresponding to the third clock CK_IB is not '1' (i.e., '0'), the third result DUP is increased (operation 738).

The calibration logic 912 may check whether a sum of the third result DUP and the fourth result DDN obtained through the comparison results (e.g., XOR operation) is 256 (operation 740). Because the third result DUP or the fourth result DDN is increased corresponding to each bit of the 256-bit data sequence, the sum of the third result DUP and the fourth result DDN corresponding to 256 bits of the data sequence should be 256.

If the sum of the third result DUP and the fourth result DDN is not 256 (NO in the operation 740), the comparison results performed by the calibration logic 912 would be unreliable. In this case, the calibration logic 912 can set four results PUP, PDN, DUP, DDN, which are output from the counter 556 of the bang-bang phase detector 500 in the calibration logic 912, to '0' (operation 708). Thereafter, the comparison operation may be performed again.

If the sum of the third result DUP and the fourth result DDN is 256 (YES in the operation 740), a first phase shift variable P_shift and a second phase shift variable D_shift for a phase shift based on the four results PUP, PDN, DUP, DDN output from the counter 556 can be determined (operation 742). Referring to FIG. 6, a phase of sampled data DQ-VrefQ corresponding to the set reference voltage VrefQ may be adjusted according to the first phase shift variable P_shift. For example, when the first phase shift variable P_shift is greater than '0' (P_shift>0), the phase of the sampled data DQ-VrefQ corresponding to the set reference voltage VrefQ can be reversed (see a top in FIG. 6). Conversely, if the first phase shift variable P_shift is less than '0' (P_shift<0), the phase of the sampled data DQ-VrefQ corresponding to the reference voltage VrefQ may move forward (see a bottom of FIG. 6). The second phase shift variable D_shift can be used similarly to the first phase shift variable P_shift. According to an embodiment, the second phase shift variable P_shift can be determined based on a difference between the first result PUP and the second result PDN, and the second phase shift variable D_shift can be determined based on a difference between the third result DUP and the fourth result DDN (operation 742).

Based on the first phase shift variable P_shift and the second phase shift variable D_shift, the calibration logic 912 can determine a first control code VRCODE corresponding to the set reference voltage VrefQ, and determine a second control code DLCODE corresponding to a data sampling clock CK_Q, CK_QB (operation 744). For example, the calibration logic 912 may select one in ranges of code values for the set reference voltage VrefQ stored in the calibration buffer 914. A plurality of codes (e.g., digital values) corresponding to the level of the set reference voltage VrefQ may be preset and stored in the calibration buffer 914 in a table form or the like. The calibration logic 912 may store a new first control code VRCODE obtained from adding the second phase shift variable D_shift to the current first control code VRCODE. Similarly, a plurality of codes (e.g., digital values) according to phases of the data sampling clock CK_Q, CK_QB may be preset and stored in the calibration buffer 914. The calibration logic 912 may select one of the preset codes stored in the calibration buffer 914. The calibration logic 912 may store the new second control code DLCODE obtained from adding the first phase shift variable P_shift to the current second control code DLCODE.

When both the first phase shift variable P_shift and the second phase shift variable D_shift do not become '0' (NO in the operation 746), the calibration logic 912 may receive a 256-bit data sequence (operation 706). The calibration logic 912 can calculate the four results PUP, PDN, DUP, DDN according to the above-described comparison operations until both the first phase shift variable P_shift and the second phase shift variable D_shift become '0'. The operation of determining the first phase shift variable P_shift and the second phase shift variable D_shift for the phase shift based on the four results PUP, PDN, DUP, DDN may be repeated (operation 746). When both the first phase shift variable P_shift and the second phase shift variable D_shift are '0' (YES in the operation 746), the calibration logic 912 can find the set reference voltage VrefQ corresponding to the cross point. Therefore, the iterative operations may be terminated (operation 748).

Referring to FIG. 7, the bang-bang phase detector 550 may include a first comparison unit 554, a second comparison unit 552, and a counter 556. The first comparison unit 554 can include a plurality of sampling units configured to convert comparison results of the data sequence DQ and the set reference voltage VrefQ into the sampled data D_I, D_Q, D_IB, D_QB corresponding to the four clocks CK_I, CK_Q, CK_IB, CK_QB, a plurality of first logic gates configured to output an exclusive OR (XOR) result for two among the sampled data D_I, D_Q, D_IB, D_QB, and a plurality of flip-flops coupled to the plurality of first logic gates. An internal configuration of the first comparator 554 may be substantially similar to that of a conventional bang-bang phase detector.

The second comparator 552 in the bang-bang phase detector 550 can be operatable to more quickly detect the cross point based on the frequency of '1'. The second comparator 552 can include a plurality of second logic gates configured to output a plurality of XOR (exclusive OR) results between '1' and each of the sampled data D_I, D_IB corresponding to the two clocks CK_I, CK_IB which are the duty cycle clocks, and a plurality of flip-flops respectively coupled to the plurality of second logic gates.

The counter 556 in the bang-bang phase detector 550 can be coupled to the plurality of flip-flops in the first comparator 554 and the plurality of flip-flops in the second comparator 552, so as to increase (or count) four results PUP, PDN, DUP, DDN. The counter 556 capable of incrementing each of the four results PUP, PDN, DUP, DDN can operate substantially similar to the operations described in FIG. 5.

Figure 8:
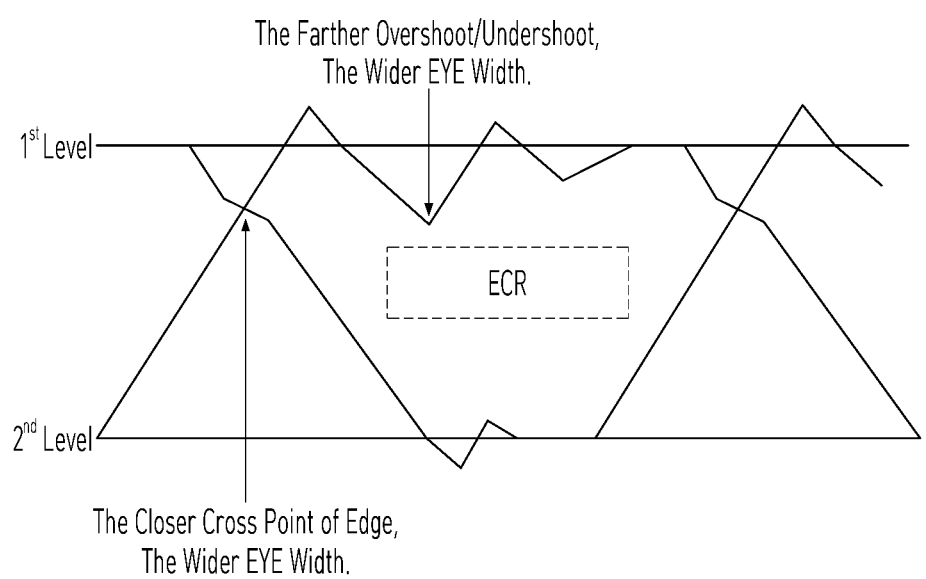
FIG. 8 illustrates a third example of the calibration operation according to an embodiment of the present disclosure.

FIG. 8 illustrates a third example of the calibration operation according to an embodiment of the present disclosure.

Referring to FIGS. 3 and 8, even if a target range of eye width scanning is limited in order to reduce time and power consumed in the second operation of finding a voltage level ('A' shown in FIG. 3) having the widest eye width during the calibration operation, it might be possible that calibration performance does not become deteriorated.

The eye width scanning for the calibration operation is a type of calibration technique used in a high-speed digital communication system to optimize a timing and a voltage level of transmitted signals or data. A signal transmitted in the high-speed digital communication system may be exposed to various types of distortion such as jitter, noise, or inter-symbol interference (ISI). Due to this distortion, an error may occur in the received signal, which may degrade or affect overall performance of the high-speed digital communication system. The eye width scanning may be used to determine optimal timing and voltage level of the transmitted signal to mitigate the distortion. The eye width scanning may involve changing a timing and a voltage level of the transmitted signal while monitoring an eye diagram which is a graphical representation of the received signal.

The eye-width scanning operation can involve transmitting a series of test patterns (e.g., a DC balanced sequence) with different timings and voltage levels. An eye diagram can then be constructed by plotting the voltage levels and timings of the received signals, and the eye width can be defined as a distance between two points on the eye diagram where a signal crosses a decision threshold. By changing the timing and voltage level of the transmitted signal, the optimal timing and the voltage level associated with the widest eye width could be identified or recognized through the eye width scanning operation. This information can then be used to calibrate a transceiver in the high-speed digital communication system for ensuring optimal performance of the high-speed digital communication system.

As shown in FIG. 3, issues such as ringing, overshooting, or undershooting may occur in the data or signals. The eye width may widen as it moves away from overshooting or undershooting. A position that can be farthest from overshooting and undershooting may be the reference center voltage level that is a mean level between the $1^{st}$ level and the $2^{nd}$ level. In addition, the closer the cross point (CP), the wider the eye width. Therefore, an effective check region ECR (or a target range) that needs to perform the eye width scanning to find the voltage level ('A' shown in FIG. 3) with the widest eye width can be determined based on the reference center voltage level and the set voltage level corresponding to the cross point. Accordingly, during the calibration operation, the eye width scanning may be iteratively performed from the set reference voltage VrefQ corresponding to the cross point to the reference center voltage level VcentQ.

Figure 9:
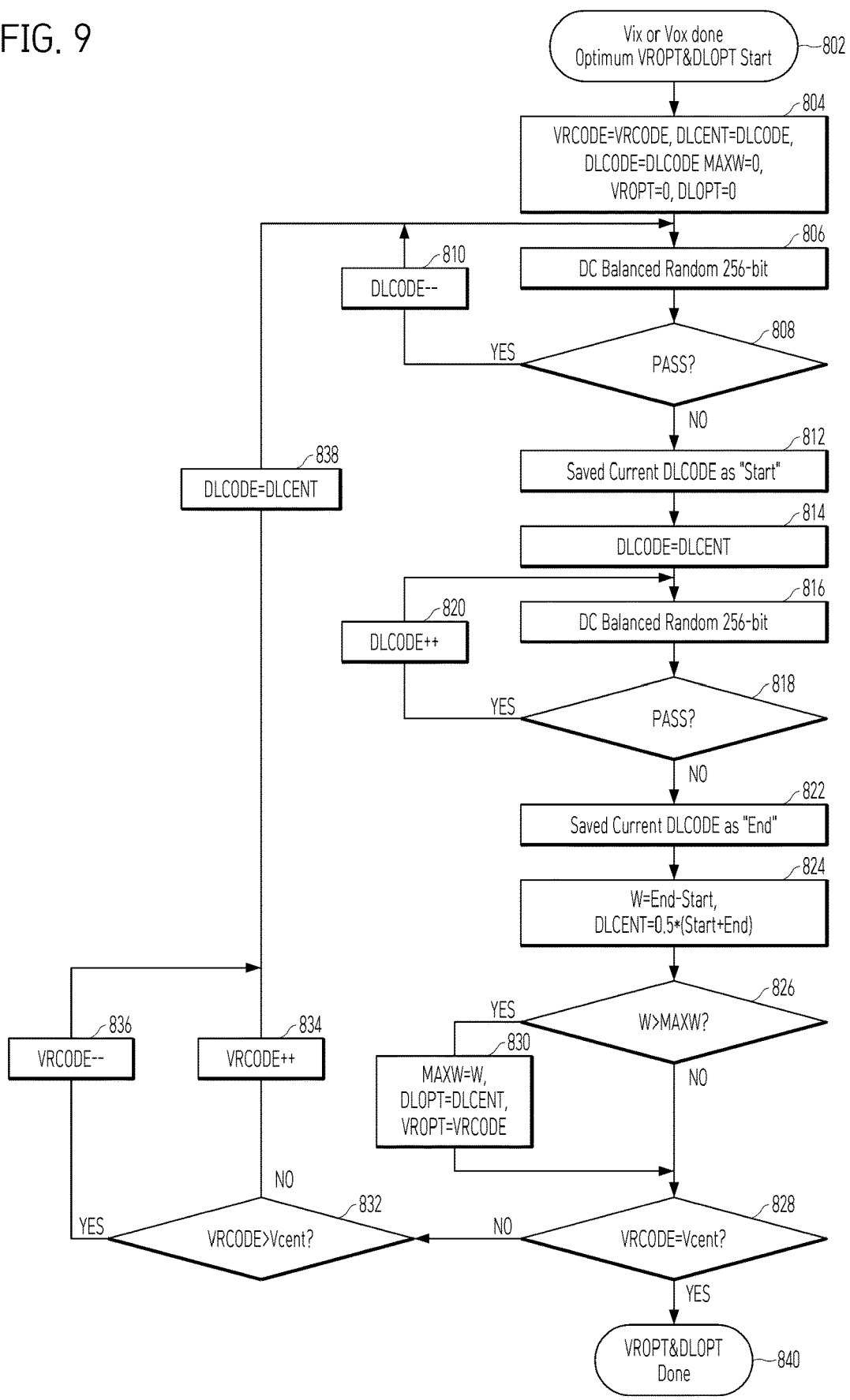
FIG. 9 illustrates a second operation for the calibration according to an embodiment of the present disclosure.

FIG. 9 illustrates a second operation for the calibration according to an embodiment of the present disclosure. For example, the second operation for the calibration described in FIG. 9 can include checking the eye width described in FIG. 4 (operation 604), increasing or decreasing the set reference voltage VrefQ (operation 606), and storing the set reference voltage VrefQ and the quadrature phase clock CK_Q corresponding to the largest (or widest) eye width (operation 608).

Referring to FIGS. 2 and 9, after finding the set reference voltage VrefQ corresponding to the cross point (Vix or Vox done), the calibration logic can perform the eye width scanning to find the optimal eye width (operation 802).

The calibration logic 912 may initialize parameters for the eye width scanning (operation 804). For example, the first control code VRCODE corresponding to the set reference voltage VrefQ can maintain a previous value, and the second control code DLCODE corresponding to the data sampling clocks CK_Q, CK_QB also can maintain previous values. The center code DLCENT corresponding to the data sampling clocks CK_Q, CK_QB is initially set as the second control code DLCODE. A maximum eye width MAXW can be set to '0', and an optimal reference voltage VROPT can also be set to '0'. In addition, the third control code DLOPT corresponding to the optimal data sampling clocks CK_Q, CK_QB may also maintain a previous value.

The calibration logic 912 may receive the 256-bit data sequence DQ (operation 806). In this case, the 256-bit data sequence and the 256-bit inverted data sequence may be a sequence of data having the same frequency of '0' and '1' (i.e., DC balanced data).

As described above, the calibration logic 912 can perform the eye width scanning from the set reference voltage VrefQ corresponding to the cross point. In response to the set reference voltage VrefQ corresponding to the cross point, the calibration logic 912 can sample a 256-bit data sequence based on the second control code DLCODE corresponding to the data sampling clocks CK_Q, CK_QB, and determine whether to pass sampled data (operation 808). If the sampled data passes (YES in operation 808), the calibration logic 912 can decrease the second control code DLCODE (operation 810). The calibration logic 912 may receive the 256-bit data sequence DQ based on a reduced second control code DLCODE (operation 806). If the sampled data does not pass (NO in operation 808), the calibration logic 912 can store a current second control code DLCODE as a starting point (operation 812). Here, the starting point (Start) may indicate a starting point of the eye width (e.g., a left point of each of the eye width arrows A, B in FIG. 3, or a left point of the eye width arrow in FIG. 10).

Referring to FIGS. 8 to 9, the operation of finding the starting point (Start) can be carried out as follows. When phases of the data sampling clocks CK_Q, CK_QB are adjusted in a state where the set reference voltage VrefQ corresponding to the cross point is determined, sampled values of the 256-bit data sequence may vary. Because the 256-bit data sequence is a type of data (DC balanced data) in which frequencies of '0' and '1' are equal, the calibration logic 912 can calculate the number of edges falling from the $1^{st}$ level to the $2^{nd}$ level. While pulling the timing (e.g., decreasing the second control code DLCODE, operation 810), the calibration logic 912 can check whether the frequencies of 0 and 1 are the same in the sampled value of the 256-bit data sequence (e.g., whether the sampled data passes or not, operation 808).

Referring to FIG. 9, the calibration logic 912 determines the start point (Start) of the eye width (operation 812), and then determines the end point (End) of the eye width (operation 822), so that the eye width (W) can be determined (operation 824). To find the end point (End) of the eye width, the calibration logic 912 resets the second control code DLCODE to the center code DLCENT (operation 814).

Calibration logic 912 may receive the 256-bit data sequence (DQ) (operation 816). The calibration logic 912 samples the 256-bit data sequence based on the reset second control code DLCODE and determines whether the sampled data passes (operation 818). If the sampled data passes (YES in operation 818), the calibration logic 912 increases the second control code DLCODE (operation 820). The calibration logic 912 may receive the 256-bit data sequence DQ based on an increased second control code DLCODE (operation 816). If sampled data does not pass (NO in operation 818), the calibration logic 912 can store a current second control code DLCODE as an end point (operation 822). Here, the end point (End) may indicate an end point of the eye width (e.g., a right point of each of the eye width arrows A, B in FIG. 3 or a right point of the eye width arrow in FIG. 10).

Referring to FIGS. 8 to 9, the operation of finding the end point (End) can be performed as follows. When the phases of the data sampling clocks CK_Q, CK_QB are adjusted in a state where the set reference voltage VrefQ corresponding to the cross point is determined, a sampled value of the 256-bit data sequence may vary. Because the 256-bit data sequence is a type of data (DC balanced data) in which the frequencies of 0 and 1 are the same, the calibration logic 912 can delay a timing of the edge rising from the $2^{nd}$ level to the $1^{st}$ level (e.g., increase the second control code DLCODE, operation 820), check whether the frequencies of 0 and 1 are the same in the sampled value of the 256-bit data sequence (e.g., whether the sampled data passes or not, operation 818).

After finding the starting point (Start) and the ending point (End) corresponding to the set reference voltage VrefQ (the operations 812, 822), the calibration logic 912 can determine a difference between the starting point (Start) and the ending point (End) as an eye width W. The calibration logic 912 can determine a center code DLCENT as a value obtained from multiplying the sum of the start point (Start) and the end point (End) by 0.5 (operation 824).

The calibration logic 912 may check whether the eye width W is greater than the maximum eye width MAXW (operation 826). Because the maximum eye width MAXW is initially set as '0', a first recognized eye width W may be stored as the maximum eye width MAXW (operation 830). Subsequently, if the eye width W is greater than the maximum eye width MAXW (YES in operation 826), a current eye width W greater than a previously stored maximum eye width MAXW can be updated to the maximum eye width MAXW (operation 830). In addition, whenever the maximum eye width MAXW is updated, the calibration logic 912 can determine the current reference voltage VRCODE and the current center code DLCENT as the optimal reference voltage VROPT and the third control code DLOPT (operation 830). If the eye width W is less than the previously stored maximum eye width MAXW (NO in operation 826), the calibration logic 912 may not update the maximum eye width MAXW, the optimal reference voltage VROPT, and the third control code DLOPT.

The calibration logic 912 may check whether the first control code VRCODE corresponds to the reference center voltage Vcent (operation 828). If the first control code VRCODE indicates the reference center voltage Vcent (YES in operation 828), the calibration logic 912 may terminate the eye width scanning (operation 840).

If the first control code VRCODE is not the reference center voltage Vcent (NO in operation 828), the calibration logic 912 may check whether the first control code VRCODE is greater than the reference center voltage Vcent (operation 832). If the first control code VRCODE is greater than the reference center voltage Vcent (YES in operation 832), the calibration logic 912 may decrease the first control code VRCODE (operation 836). Conversely, if the first control code VRCODE is less than the reference center voltage Vcent (NO in operation 832), the calibration logic 912 may increase the first control code VRCODE (operation 834). After increasing the first control code VRCODE (operations 834, 836), the calibration logic 912 can reset the second control code DLCODE to the center code DLCENT (operation 838).

In an embodiment of the present invention, time and power consumed by the calibration operation could be reduced by limiting the target range of the eye width scanning. The target range of eye width scanning may be limited from the set reference voltage VrefQ corresponding to the cross point to the reference center voltage Vcent. Because the set reference voltage VrefQ corresponding to the cross point may be greater or less than the reference center voltage Vcent, the calibration logic 912 may check whether the first control code VRCODE is greater than the reference center voltage Vcent (operation 832) to increase or decrease the set reference voltage VrefQ toward the reference center voltage Vcent.

In response to a changed set reference voltage level (i.e., increase/decrease of the first control code VRCODE, operations 834, 836), the calibration logic 912 may receive a 256-bit data sequence DQ (operation 806). The calibration logic 912 may perform the eye width scanning by sampling the 256-bit data sequence based on the reset second control code DLCODE.

Figure 10:
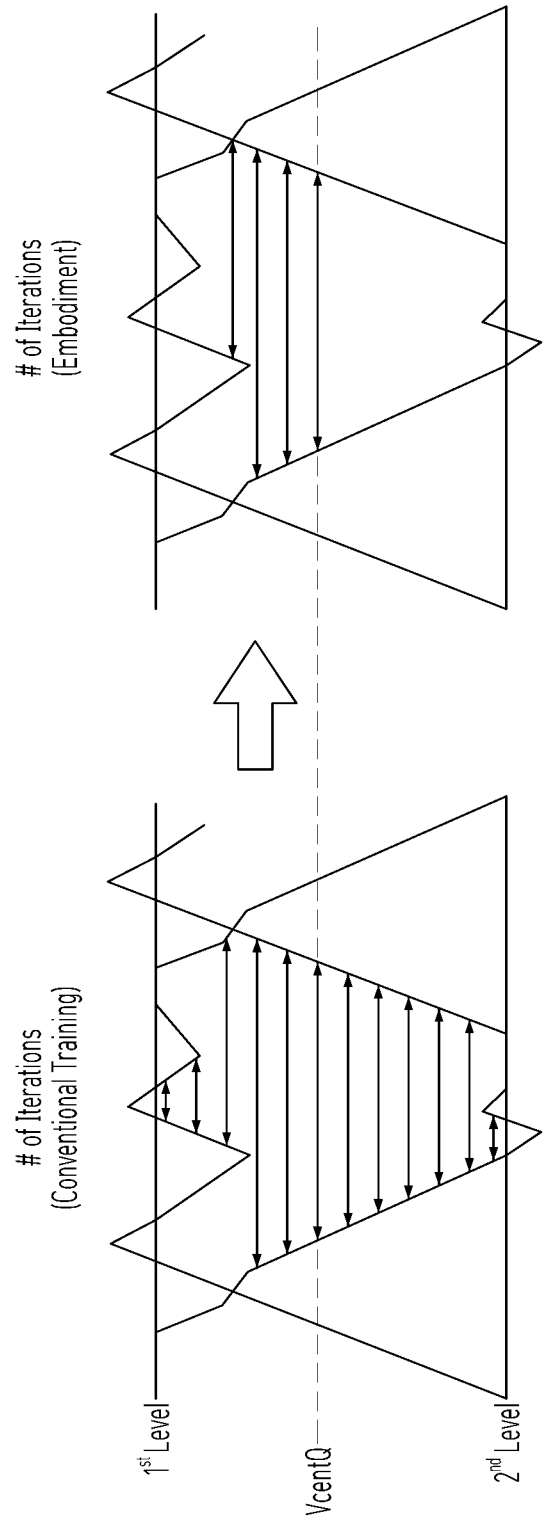
FIG. 10 illustrates an effect of a calibration device and a calibration method according to an embodiment of the present disclosure.

FIG. 10 illustrates an effect of a calibration device and a calibration method according to an embodiment of the present disclosure.

Referring to FIG. 10, it can be shown that the number of iterations performed by the calibration logic for the calibration operation is changed according to an embodiment of the present invention, which is different from the conventional case. Conventionally, the eye width scanning was iteratively performed in a range between the $1^{st}$ level and the $2^{nd}$ level. However, the eye width scanning according to an embodiment of the present invention can be iteratively performed based on a criterion corresponding to the cross point. The eye width scanning is performed only from the level of the set reference voltage VrefQ to the level of the reference center voltage VcentQ. Accordingly, the number of iterations for the eye width scanning can be reduced, and time and power consumed in the calibration operation could be reduced.

As above described, a calibration device according to an embodiment of the present invention can reduce time and power consumed for calibrating data or signals transmitted and received via data lines.

In addition, in a low-power memory device or memory system according to an embodiment of the present invention, degradation of data input/output performance may be avoided or reduced.

In addition, in a memory device or memory system according to an embodiment of the present invention, it could be suppressed, avoided, or reduced that data or signals expose to crosstalk, ringing, overshooting, or undershooting which may occur due to simultaneous switching noise (SSN) in a data channel shared by a plurality of memory dies.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods or operations of the computer, processor, controller, or other signal processing device, are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, generators, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, generators, logic, interfaces, decoders, drivers, generators and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods or operations of the computer, processor, microprocessor, controller, or other signal processing device, are described in detail, the code or instructions for implementing the operations of the method embodiments may transform the computer, processor, controller, or other signal processing device into a special-purpose processor for performing the methods described herein.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A calibration device coupled to a communication line shared by plural devices, wherein the calibration device is configured to:

perform an iterative eye width scanning by adjusting a set voltage level by a preset level from a first voltage level to a reference center voltage level, wherein the first voltage level corresponds to a cross point where values of signals or data, which are transmitted via the communication line, are changed in different directions; and set, as a zero crossing for the signals or the data, a voltage level corresponding to a largest value among a plurality of eye widths obtained through the iterative eye width scanning.

2. The calibration device according to claim 1, wherein the calibration device is further configured to:

transmit a preset sequence and an inverted sequence of the preset sequence to at least one of the plural devices; and detect the cross point which is an intersection of the preset sequence and the inverted sequence, and wherein the preset sequence and the inverted sequence are DC balanced data having a same frequency of '0' and '1'.

3. The calibration device according to claim 2, wherein the calibration device is further configured to perform compensation or adjustment for a quadrature phase by using four different phase clocks including two duty-cycle clocks and two quadrature phase clocks.

4. The calibration device according to claim 3, wherein the calibration device comprises a bang-bang phase detector using the four different phase clocks, and wherein the bang-bang phase detector is configured to detect the cross point based on the frequency of '1'.

5. The calibration device according to claim 4, wherein the bang-bang phase detector comprises:

plural first logic gates each configured to output a result of an exclusive OR (XOR) operation on two among data sampled by the four different phase clocks;

plural second logic gates each configured to output a result of an exclusive OR (XOR) operation on a value of '1' and each data piece sampled by the two quadrature phase clocks;

plural flip-flops coupled to the plural first logic gates and the plural second logic gates; and a counter configured to increase or decrease at least one parameter associated with the four different phase clocks based on the plural flip-flops.

6. The calibration device according to claim 3, wherein the calibration device performs the iterative eye width scanning by:

adjusting the set voltage level from the first voltage level to the reference center voltage by the preset level;

performing iterative scanning for adjusting the two quadrature phase clocks to measure a start and an end of an eye width corresponding to an adjusted set voltage level for determining a current eye width; and replacing a previously stored eye width obtained during the iterative scanning with the current eye width when the current eye width is larger than the previously stored eye width, and wherein the calibration device determines, as the zero crossing, a voltage level corresponding to the stored eye width.

7. The calibration device according to claim 1, wherein the calibration device performs the iterative eye width scanning and determines the zero crossing for each of the plural devices in a separate and independent manner, the signals or the data exposed to crosstalk, ringing, overshooting, or undershooting due to a simultaneous switching noise while transmitted via the communication line.

8. A memory system, comprising:

plural memory dies configured to store data;

a data channel shared by the plural memory dies; and a memory controller configured to:

perform an iterative eye width scanning by adjusting a set voltage level by a preset level from a first voltage level to a reference center voltage level, wherein the first voltage level corresponds to a cross point where values of signals or data, which are transferred through the data channel, are changed in different directions;

determine, as a zero crossing for the signals or the data, a voltage level corresponding to a largest value among a plurality of eye widths determined through the iterative eye width scanning; and exchange the signals or the data with the plural memory dies via the data channel based on the zero crossing to control a data input/output operation performed on the plural memory dies.

9. The memory system according to claim 8, wherein the memory controller comprises:

a calibration logic configured to transmit a preset data sequence and an inverted sequence of the preset data sequence to the plural memory dies to detect the cross point; and a calibration buffer configured to store the zero crossing for each of the plural memory dies, the zero crossing output from the calibration logic.

10. The memory system according to claim 9, wherein the preset data sequence and the inverted sequence are DC balanced data having a same frequency of '0' and '1'.

11. The memory system according to claim 9, wherein the calibration logic is further configured to perform compensation or adjustment for a quadrature phase by using four different phase clocks including two duty-cycle clocks and two quadrature phase clocks.

12. The memory system according to claim 11, wherein the calibration logic comprises a bang-bang phase detector using the four different phase clocks, and wherein the bang-bang phase detector is configured to detect the cross point based on the frequency of '1'.

13. The memory system according to claim 12, wherein the bang-bang phase detector comprises:

plural first logic gates each first logic gate configured to output a result of an exclusive OR (XOR) operation on two among data sampled by the four different phase clocks;

plural second logic gates each configured to output a result of an exclusive OR (XOR) operation on a value of '1' and each data piece sampled by the two quadrature phase clocks;

plural flip-flops coupled to the plural first logic gates and the plural second logic gates; and a counter configured to increase or decrease at least one parameter associated with the four different phase clocks based on the plural flip-flops.

14. The memory system according to claim 11, wherein the calibration logic is further configured to perform the iterative eye width scanning by:

adjusting the set voltage level from the first voltage level to the reference center voltage by the preset level;

performing iterative scanning for adjusting the two quadrature phase clocks to measure a start and an end of an eye width corresponding to an adjusted set voltage level for determining a current eye width; and replacing a previously stored eye width obtained during the iterative scanning with the current eye width when the current eye width is larger than the previously stored eye width, and wherein the calibration logic is further configured to determine, as the zero crossing, a voltage level corresponding to a stored eye width.

15. The memory system according to claim 8, wherein the memory controller performs the iterative eye width scanning and determines the zero crossing for the individual memory dies in a separate and independent manner, the signals or the data exposed to crosstalk, ringing, overshooting, or undershooting due to a simultaneous switching noise while transmitted via the data channel.

16. A method for operating a memory system, comprising:
  detecting a cross point where values of signals or data are changed in different directions, so as to exchange the data or the signals with plural memory dies via a data channel shared by the plural memory dies;
  performing an iterative eye width scanning by adjusting a set voltage level by a preset level from a first voltage level, which corresponds to the cross point, to a reference center voltage level; and
  determining, as a zero crossing for the signals or the data, a voltage level corresponding to a largest value among a plurality of eye widths obtained through the iterative eye width scanning.

17. The method according to claim 16,
  wherein the detecting of the cross point comprises transmitting a preset data sequence and an inverted sequence of the preset data sequence to at least one of the plural memory dies, and
  wherein the preset data sequence and the inverted sequence are DC balanced data having a same frequency of '0' and '1'.

18. The method according to claim 17, wherein the cross point is detected based on the frequency of '1' of the preset data sequence and the inverted sequence.

19. The method according to claim 16, wherein the performing the iterative eye width comprises:
  adjusting the set voltage level from the first voltage level to the reference center voltage by the preset level;
  performing iterative scanning for adjusting two quadrature phase clocks to measure a start and an end of an eye width corresponding to an adjusted set voltage level for determining the current eye width; and
  replacing a previously stored eye width obtained during the iterative scanning with the current eye width when the current eye width is larger than the previously stored eye width.

20. The method according to claim 16, wherein the detecting, the performing and the determining are performed for the individual memory dies in a separate and independent manner.

* * * * *